(12) United States Patent
Wong et al.

(10) Patent No.: US 11,366,162 B2
(45) Date of Patent: Jun. 21, 2022

(54) SCAN OUTPUT FLIP-FLOP WITH POWER SAVING FEATURE

(71) Applicant: MEDIATEK INC., Hsin-Chu (TW)

(72) Inventors: Wei-Zhe Wong, Hsinchu (TW); Heng-Liang Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/198,276

(22) Filed: Mar. 11, 2021

(65) Prior Publication Data
US 2021/0325457 A1 Oct. 21, 2021

Related U.S. Application Data

(60) Provisional application No. 63/010,712, filed on Apr. 16, 2020.

(51) Int. Cl.
*G01R 31/3185* (2006.01)
*G01R 31/3177* (2006.01)
*G01R 31/317* (2006.01)

(52) U.S. Cl.
CPC . *G01R 31/318541* (2013.01); *G01R 31/3177* (2013.01); *G01R 31/31712* (2013.01); *G01R 31/31727* (2013.01)

(58) Field of Classification Search
CPC ...... G01R 31/318541; G01R 31/31712; G01R 31/31727; G01R 31/3177
See application file for complete search history.

(56) References Cited

U.S. PATENT DOCUMENTS

| | | | |
|---|---|---|---|
| 7,831,871 B2 | 11/2010 | Ross | |
| 9,310,435 B2 | 4/2016 | Chen | |
| 9,557,380 B2 | 1/2017 | Chen | |
| 10,361,686 B2 | 7/2019 | Hsieh | |
| 2003/0204802 A1 | 10/2003 | Sim | |
| 2008/0101513 A1 | 5/2008 | Zhu | |
| 2014/0075089 A1 | 3/2014 | Bartling | |
| 2017/0269156 A1 | 9/2017 | Fel | |
| 2018/0203067 A1* | 7/2018 | Chen | G11C 29/46 |
| 2018/0375500 A1* | 12/2018 | Hsieh | G01R 31/318541 |
| 2021/0359667 A1* | 11/2021 | Dia | G01R 31/31721 |

FOREIGN PATENT DOCUMENTS

TW   I475352 B   3/2015

OTHER PUBLICATIONS

A. Mishra, N. Sinha, Satdev, V. Singh, S. Chakravarty and A. D. Singh, "Modified Scan Flip-Flop for Low Power Testing," 2010 19th IEEE Asian Test Symposium, Shanghai, China, 2010, pp. 367-370. (Year: 2010).*

* cited by examiner

*Primary Examiner* — Cynthia Britt
(74) *Attorney, Agent, or Firm* — Winston Hsu (57) ABSTRACT

A scan output flip-flop includes a selection circuit, a control circuit, and a scan-out stage circuit. The selection circuit is controlled by a first test enable signal to transmit a data signal on a first input terminal or a test signal on a second input terminal to an output terminal to serve as an input signal. The control circuit is controlled by a first clock signal and a second clock signal to generate a first control signal and a second control signal according to the input signal. The scan-out stage circuit receives only one of the first control signal and the second control signal, and is controlled by the first test enable signal and a second test enable signal to generate a scan-out signal.

24 Claims, 8 Drawing Sheets

SCAN OUTPUT FLIP-FLOP WITH POWER SAVING FEATURE

CROSS REFERENCE TO RELATED APPLICATIONS

This application claims the benefit of U.S. provisional application No. 63/010,712, filed on Apr. 16, 2020 and incorporated herein by reference.

BACKGROUND

The present invention relates to a flip-flop design, and more particularly, to a scan output flip-flop with a gating function applied to a scan-output signal and/or a data-out signal for power saving.

Scan chains are applied to detect various manufacturing faults in combinatorial logic blocks during test procedures. Generally, a scan chain is composed of several scan output flip-flops which are coupled in series, and a delay chain is added in the scan path between a data output terminal of one scan output flip-flop and a scan input terminal of the following scan output flip-flop. One conventional scan output flip-flop may use a common output terminal for normal data and scan data transmission. However, in a normal mode, the buffers in the delay chains still operate, which increase unnecessary power consumption. Thus, there is a need for an innovative scan output flip-flop design which can achieve power reduction with low area penalty.

SUMMARY

One of the objectives of the claimed invention is to provide a scan output flip-flop with a gating function applied to a scan-output signal and/or a data-out signal for power saving.

According to a first aspect of the present invention, an exemplary scan output flip-flop for outputting a scan-out signal at a scan output terminal of the scan output flip-flop is disclosed. The exemplary scan output flip-flop includes a selection circuit, a control circuit, and a scan-out stage circuit. The selection circuit has a first input terminal and a second input terminal, and is controlled by a first test enable signal to transmit a data signal on the first input terminal or a test signal on the second input terminal to an output terminal of the selection circuit to serve as an input signal. The control circuit is coupled to the output terminal of the selection circuit, and controlled by a first clock signal and a second clock signal to generate a first control signal and a second control signal according to the input signal, wherein the second clock signal is an inverse of the first clock signal, and the second control signal is an inverse of the first control signal. The scan-out stage circuit is controlled by the first test enable signal and a second test enable signal to generate the scan-out signal according to only one of the first control signal and the second control signal, where the second test enable signal is an inverse of the first test enable signal.

According to a second aspect of the present invention, an exemplary scan output flip-flop for outputting a data-out signal at a data output terminal of the scan output flip-flop is disclosed. The exemplary scan output flip-flop includes a selection circuit, a control circuit, and a data-out stage circuit. The selection circuit has a first input terminal and a second input terminal, and is controlled by a first test enable signal to transmit a data signal on the first input terminal or a test signal on the second input terminal to an output terminal of the selection circuit to serve as an input signal. The control circuit is coupled to the output terminal of the selection circuit, and controlled by a first clock signal and a second clock signal to generate a control signal according to the input signal, wherein the second clock signal is an inverse of the first clock signal. The data-out stage circuit receives the control signal, and is controlled by the first test enable signal and a second test enable signal to generate the data-out signal according to the control signal, wherein the second test enable signal is an inverse of the first test enable signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
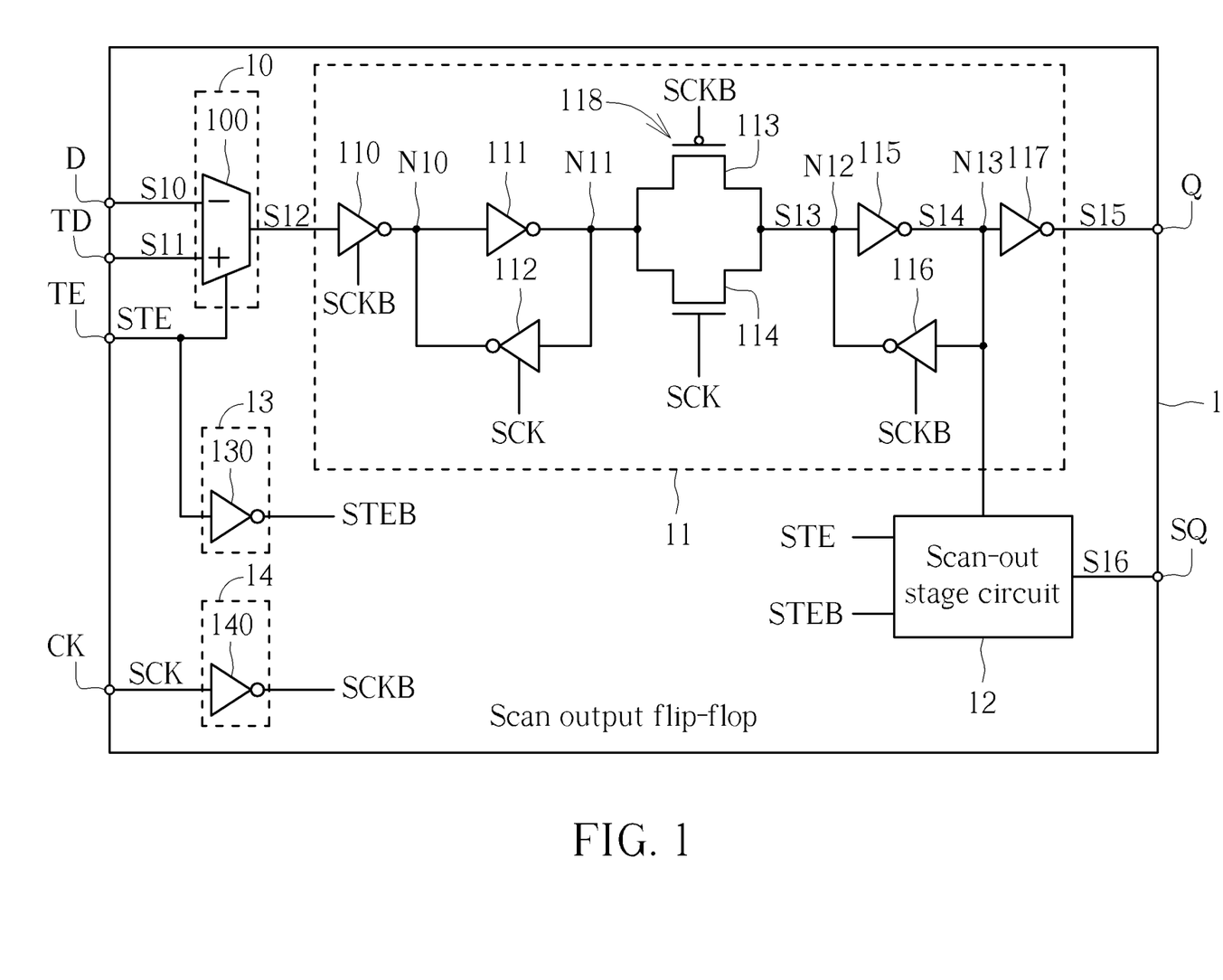
FIG. 1 is a diagram illustrating a scan output flip-flop according to an embodiment of the present invention.

FIG. 1 is a diagram illustrating a scan output flip-flop according to an embodiment of the present invention. As shown in FIG. 1, a scan output flip-flop 1 includes a selection circuit 10, a control circuit 11, a scan-out stage circuit 12, a signal generation circuit 13, and a clock generation circuit 14. The scan output flip-flop 1 has a data input terminal D, a scan input terminal TD, a test-enable terminal TE, a clock input terminal CK, a data output terminal Q, and a scan output terminal SQ. In the embodiment of FIG. 1, the selection circuit 10 includes a multiplexer 100. One input terminal (−) of the multiplexer 100 is coupled to the data input terminal D for receiving a data signal S10, another input terminal (+) of the multiplexer 100 is coupled to the scan input terminal TD for receiving a test signal S11, and a selection terminal of the multiplexer 100 is coupled to the test-enable terminal TE for receiving a test enable signal STE. The multiplexer 100 generates an input signal S12 at its output terminal. The multiplexer 100 is controlled by the test enable signal (which acts as a selection signal) STE to selectively transmit the data signal S10 or the test signal S11 to the output terminal of the multiplexer 100 to serve as the input signal S12.

As shown in FIG. 1, the signal generation circuit 13 also receives the test enable signal STE to generate another test enable signal STEB which is the inverse of the test enable signal STE. In the embodiment of FIG. 1, the signal generation circuit 13 includes an inverter 130. The input terminal of the inverter 130 is coupled to the test-enable terminal TE for receiving the test enable signal STE. Then, the inverter 130 inverts the test enable signal STE to generate the test enable signal STEB at the output terminal of the inverter 130. Thus, the test enable signal STEB is the inverse of the test enable signal STE. In other embodiments, the signal generation circuit 13 may be implemented by any other circuit structure which is capable of receiving the test enable signal STE and generating the test enable signal STEB which is the inverse of the test enable signal STE.

The clock generation circuit 14 receives a clock signal SCK through the clock terminal CK to generate another clock signal SCKB which is the inverse of the clock signal SCK. In the embodiment of FIG. 1, the clock generation circuit 14 includes an inverter 140. The input terminal of the inverter 140 is coupled to the clock terminal CK for receiving the clock signal SCK. Then, the inverter 140 inverts the clock signal SCK to generate the clock signal SCKB at the output terminal of the inverter 140. Thus, the clock signal SCKB is the inverse of the clock signal SCK. Each of the clock signals SCK and SCKB may have a high voltage level VH and a low voltage level VL, alternatingly. In other embodiments, the clock generation circuit 14 may be implemented by any other circuit structure which is capable of receiving the clock signal SCK and generating the clock signal SCKB which is the inverse of the clock signal SCK.

Referring to FIG. 1, the control circuit 11 receives the input signal S12, and is controlled by the clock signals SCK and SCKB to generate control signals S13 and S14, where only one of the control signals S13 and S14 is received by the scan-out stage circuit 12. In the embodiment of FIG. 1, the control circuit 11 includes tri-state inverters 110, 112, and 116, inverters 111, 115, and 117, and a transmission gate 118. The input terminal of the tri-state inverter 110 is coupled to the output terminal of the multiplexer 100, and the output terminal of the tri-state inverter 110 is coupled to a node N10. The tri-state inverter 110 is controlled by the clock signal SCKB generated by the clock generation circuit 14. The tri-state inverter 110 operates to perform signal inversion, only when the clock signal SCKB is at the high voltage level VH. The input terminal of the inverter 111 is coupled to the node N10, and the output terminal of the inverter 111 is coupled to a node N11. The input terminal of the tri-state inverter 112 is coupled to the node N11, and the output terminal of the tri-state inverter 112 is coupled to the node N10. The tri-state inverter 112 is controlled by the clock signal SCK. The tri-state inverter 112 operates to perform signal inversion, only when the clock signal SCK is at the high voltage level VH. The inverter 111 and the tri-state inverter 112 form a latch circuit.

The transmission gate 118 is composed of a P-type transistor 113 and an N-type transistor 114. In the embodiment, the transistors 113 and 114 are implemented by metal-oxide-semiconductor (MOS) transistors. Thus, the transistor 113 is a P-type metal-oxide-semiconductor (PMOS) transistor, while the transistor 114 is an N-type metal-oxide-semiconductor (NMOS) transistor. The gate electrode (also known as "control electrode") of the PMOS transistor 113 receives the clock signal SCKB, the source electrode of the PMOS transistor 113 is coupled to the node N11, and the drain electrode of the PMOS transistor 113 is coupled to a node N12. The gate electrode of the NMOS transistor 114 receives the clock signal SCK, the drain electrode of the NMOS transistor 114 is coupled to the node N11, and the source electrode of the NMOS transistor 114 is coupled to the node N12. The transmission gate 118 is controlled by the clock signals SCK and SCKB to generate the control signal S13 at the node N12 according to the signal at the node N11.

The input terminal of the inverter 115 is coupled to the node N12, and the output terminal of the inverter 115 is coupled to a node N13. The inverter 115 inverts the control signal S13 at the node N12 to generate another control signal S14 at the node N13. Accordingly, the control signal S14 is the inverse of the control signal S13. The input terminal of the tri-state inverter 116 is coupled to the node N13, and the output terminal of the tri-state inverter 116 is coupled to the node N12. The tri-state inverter 116 is controlled by the clock signal SCK at the clock terminal CK. The tri-state inverter 116 operates to perform signal inversion, only when the clock signal SCKB is at the high voltage level VH. The inverter 115 and the tri-state inverter 116 form another latch circuit. The input terminal of the inverter 117 is coupled to the node N13, and the output terminal of the inverter 117 is coupled to the data output terminal Q of the scan output flip-flop 1. The inverter 117 inverts the control signal S14 at the node N13 to generate an inverted signal. The inverted signal is transmitted to the data output terminal Q to serve as a data-out signal S15. Accordingly, the data-out signal S15 is the inverse of the control signal S14.

Only one internal node of the control circuit 11 is accessed by the scan-out stage circuit 12 to provide only one control signal from the control circuit 11 to the scan-out stage circuit 12. For example, the control signal S14 derived from processing of the input signal S12 is received by the scan-out stage circuit 12, while the control signal S13 derived from processing of the input signal S12 is not received by the scan-out stage circuit 12. Since an operation of the scan-out stage circuit 12 has less impact on the control circuit 11, the control circuit 11 can be more robust.

As shown in FIG. 1, the scan-out stage circuit 12 further receives the test enable signals STE and STEB. The scan-out stage circuit 12 is controlled by the test enable signals STE and STEB to generate the scan-out signal S16 according to only one control signal (e.g., S14). The scan-out signal S16 is transmitted to the scan output terminal SQ.

When the scan output flip-flop 1 operates in a test mode, the selection circuit 10 transmits the test signal S11 to the output terminal of the selection circuit 10 according to the test enable signal STE at the high voltage level VH (STE=1) to serve as the input signal S12, and a voltage level of the scan-out signal S16 varies with a voltage level of the test signal S11.

When the scan output flip-flop 1 operates in a normal mode, the selection circuit 10 transmits the data signal S10 to the output terminal of the selection circuit 10 according to the test enable signal STE at the low voltage level VL (STE=0) to serve as the input signal S12, and the scan-out stage circuit 12 keeps the scan-out signal S16 at a fixed voltage level (e.g., a high voltage level or a low voltage level) regardless of a voltage level of the data signal S10. Multiple scan output flip-flops 1 may be applied in a scan chain, and a delay chain is added in the scan path between the scan output terminal SQ of one scan output flip-flop and the scan input terminal TD of the following scan output flip-flop. In this case, the scan-out stage circuit 12 in each scan output flip-flop gates the scan-out signal S16 of the scan output terminal SQ under the normal mode, which avoids additional power consumption by the delay chains.

Figure 2:
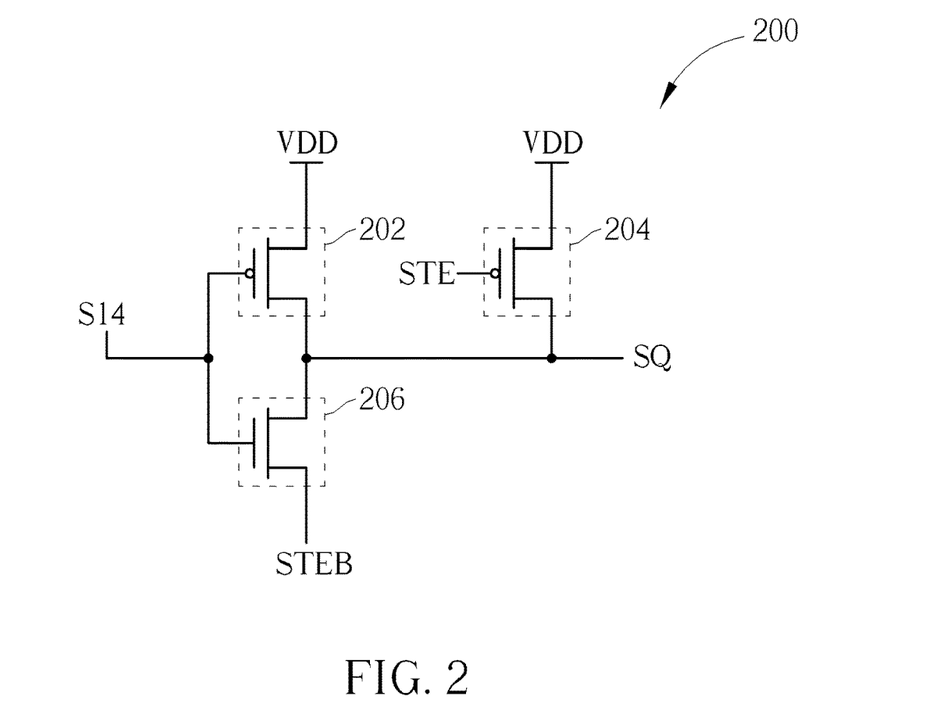
FIG. 2 is a diagram illustrating a scan-out stage circuit according to a first embodiment of the present invention.

FIG. 2 is a diagram illustrating a scan-out stage circuit according to a first embodiment of the present invention. The scan-out stage circuit 12 shown in FIG. 1 may be implemented using the scan-out stage circuit 200 shown in FIG. 2. The scan-out stage circuit 200 includes three transistors 202, 204, and 206. In the embodiment of FIG. 2, the transistors 202 and 204 are PMOS transistors, while the transistor 206 is an NMOS transistor. The gate electrode (also known as a "control electrode") of the PMOS transistor 204 is arranged to receive one test enable signal STE, the source electrode of the PMOS transistor 204 is arranged to receive one reference voltage (e.g., power supply voltage VDD that is a relatively high voltage level) of the scan-out stage circuit 200, and the drain electrode of the PMOS transistor 204 is coupled to the scan output terminal SQ. The gate electrode (also known as a "control electrode") of the PMOS transistor 202 is arranged to receive the control signal S14, the source electrode of the PMOS transistor 202 is arranged to receive one reference voltage (e.g., power supply voltage VDD) of the scan-out stage circuit 200, and the drain electrode of the PMOS transistor 202 is coupled to the scan output terminal SQ. The gate electrode (also known as a "control electrode") of the NMOS transistor 206 is arranged to receive the control signal S14, the source electrode of the NMOS transistor 206 is arranged to receive another test enable signal STEB, and the drain electrode of the NMOS transistor 206 is coupled to the scan output terminal SQ.

The scan output flip-flop 1 can selectively operate in a normal mode or a test mode in response to the test enable signal STE. When the test enable signal STE is at the high voltage level VH (STE=1), the scan output flip-flop 1 operates in the test mode. The PMOS transistor 204 is turned off due to STE=1. Since the test enable signal STEB is the inverse of the test enable signal STE, the test enable signal STEB is at the low voltage level VL (STEB=0). Hence, the PMOS transistor 202 and the NMOS transistor 206 form an inverter, such that a voltage level of the scan-out signal S16 varies with the inverse of a voltage level of the control signal S14, where the control signal S14 is derived from processing of the test signal S11.

When the test enable signal STE is at the low voltage level VL (STE=0), the scan output flip-flop 1 operates in the normal mode. Since the test enable signal STEB is the inverse of the test enable signal STE, the test enable signal STEB is at the high voltage level VH (STEB=1). Hence, the PMOS transistor 202 and the NMOS transistor 206 do not form an inverter. Specifically, a voltage level at the scan output terminal SQ is not pulled low through any of the PMOS transistor 202 and the NMOS transistor 206. In addition, the PMOS transistor 204 is turned on due to STE=0. Hence, a voltage level at the scan output terminal SQ is pulled high by the power supply voltage VDD through the PMOS transistor 204. In this way, the scan-out stage circuit 200 keeps the scan-out signal S16 at a fixed voltage level (e.g., VDD) regardless of a voltage level of the data signal S10.

Figure 3:
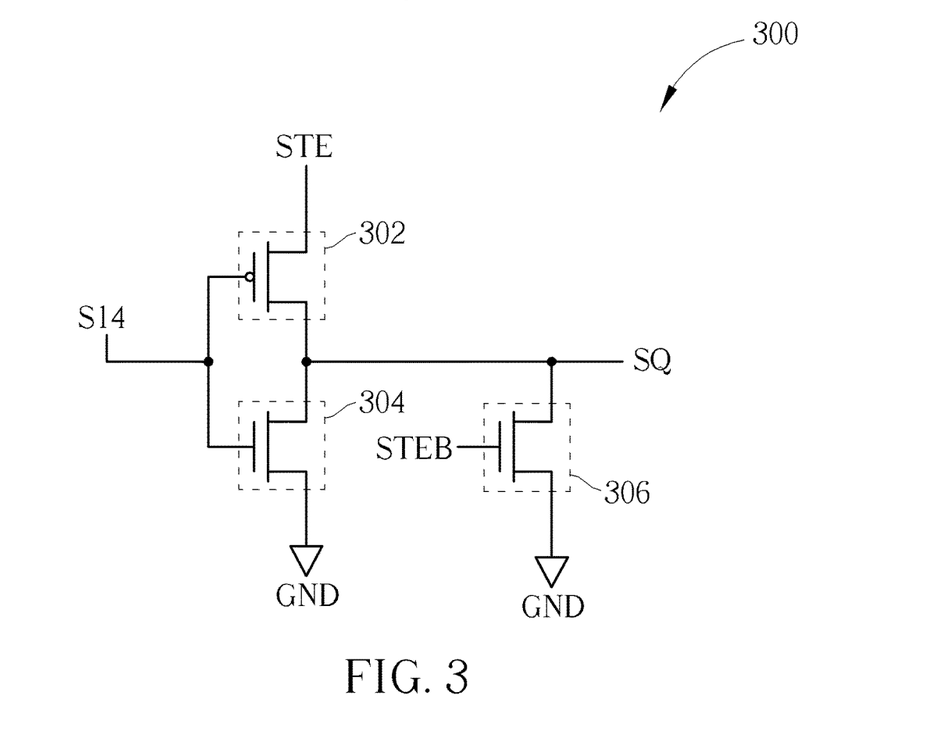
FIG. 3 is a diagram illustrating a scan-out stage circuit according to a second embodiment of the present invention.

FIG. 3 is a diagram illustrating a scan-out stage circuit according to a second embodiment of the present invention. The scan-out stage circuit 12 shown in FIG. 1 may be implemented using the scan-out stage circuit 300 shown in FIG. 3. The scan-out stage circuit 300 includes three transistors 302, 304, and 306. In the embodiment of FIG. 3, the transistor 302 is a PMOS transistor, while the transistors 304 and 306 are NMOS transistors. The gate electrode (also known as a "control electrode") of the NMOS transistor 306 is arranged to receive one test enable signal STEB, the source electrode of the NMOS transistor 306 is arranged to receive one reference voltage (e.g., ground voltage GND) of the scan-out stage circuit 300, and the drain electrode of the NMOS transistor 306 is coupled to the scan output terminal SQ. The gate electrode (also known as a "control electrode") of the NMOS transistor 304 is arranged to receive the control signal S14, the source electrode of the NMOS transistor 304 is arranged to receive one reference voltage (e.g., ground voltage GND) of the scan-out stage circuit 300, and the drain electrode of the NMOS transistor 304 is coupled to the scan output terminal SQ. The gate electrode (also known as a "control electrode") of the PMOS transistor 302 is arranged to receive the control signal S14, the source electrode of the PMOS transistor 302 is arranged to receive another test enable signal STE, and the drain electrode of the PMOS transistor 302 is coupled to the scan output terminal SQ.

The scan output flip-flop 1 can selectively operate in a normal mode or a test mode in response to the test enable signal STE. When the test enable signal STE is at the high voltage level VH (STE=1), the scan output flip-flop 1 operates in the test mode. Since the test enable signal STEB is the inverse of the test enable signal STE, the test enable signal STEB is at the low voltage level VL (STEB=0). Hence, the NMOS transistor 306 is turned off due to STEB=0. In addition, since the test enable signal STE is at the high voltage level VH (STE=1), the PMOS transistor 302 and the NMOS transistor 304 form an inverter, such that a voltage level of the scan-out signal S16 varies with the inverse of a voltage level of the control signal S14, where the control signal S14 is derived from processing of the test signal S11.

When the test enable signal STE is at the low voltage level VL (STE=0), the scan output flip-flop 1 operates in the normal mode. Since the test enable signal STE is at the low voltage level VL (STE=0), the PMOS transistor 302 and the NMOS transistor 304 do not form an inverter. Specifically, a voltage level at the scan output terminal SQ is not pulled high through any of the PMOS transistor 302 and the NMOS transistor 304. In addition, since the test enable signal STEB is the inverse of the test enable signal STE, the NMOS transistor 306 is turned on due to STEB=1. Hence, a voltage level at the scan output terminal SQ is pulled low by the ground voltage GND through the NMOS transistor 306. In this way, the scan-out stage circuit 300 keeps the scan-out signal S16 at a fixed voltage level (e.g., GND) regardless of a voltage level of the data signal S10.

Each of the scan-out stage circuits 200 and 300 requires only three extra transistors, and therefore has low area penalty. In addition to the power saving feature, the proposed scan-out stage circuit may further have other features. For example, the proposed scan-out stage circuit may have delay element(s) added for avoiding hold time violation in the scan path.

Figure 4:
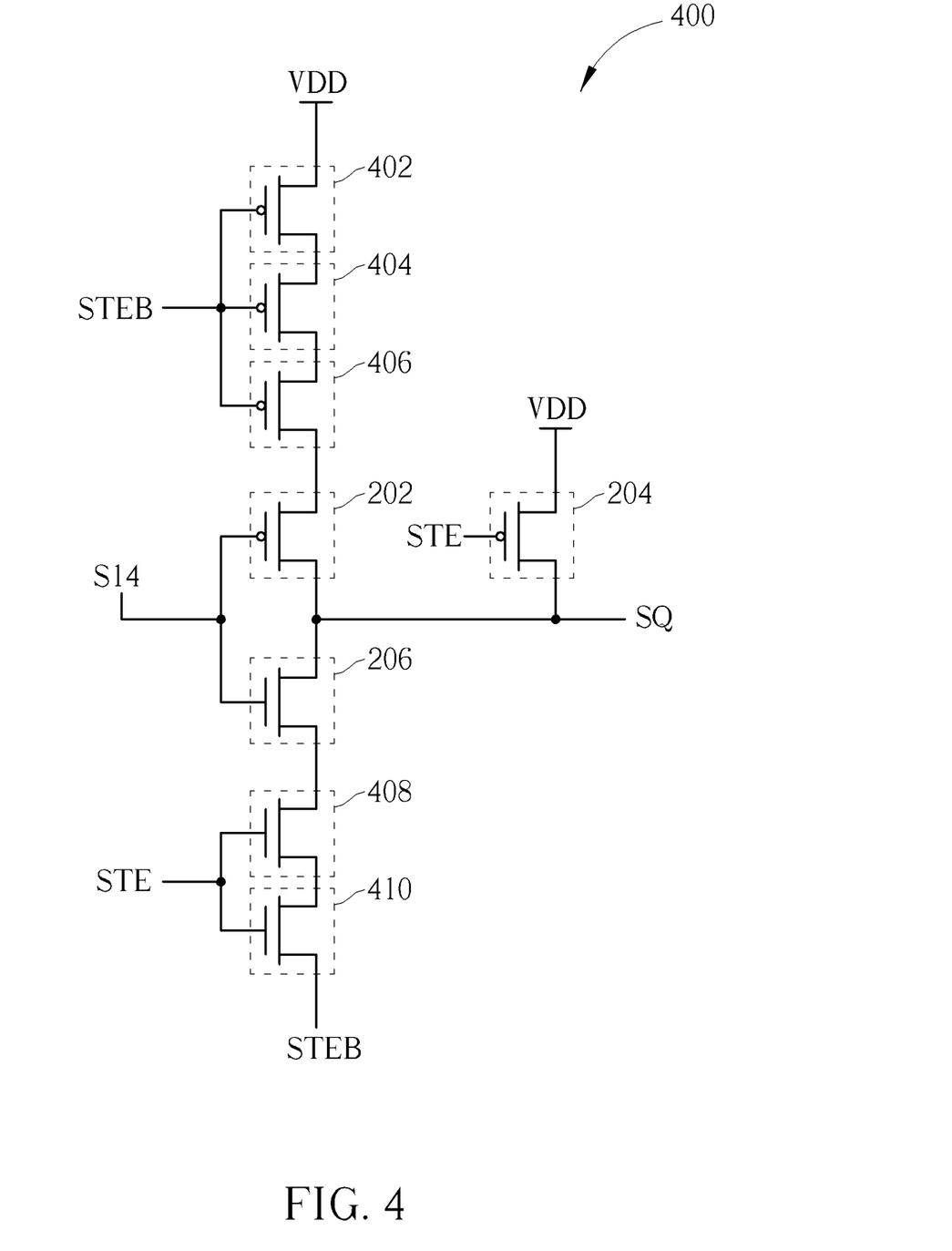
FIG. 4 is a diagram illustrating a scan-out stage circuit according to a third embodiment of the present invention.

FIG. 4 is a diagram illustrating a scan-out stage circuit according to a third embodiment of the present invention. The major difference between the scan-out stage circuits 200 and 400 is that the scan-out stage circuit 400 has at least one first delay element coupled between the reference voltage (e.g., VDD) and the source electrode of the PMOS transistor 202 and at least one second delay element coupled between the test enable signal STEB and the source electrode of the NMOS transistor 206. In this embodiment, each first delay element is implemented by a PMOS transistor, and each second delay element is implemented by an NMOS transistor. As shown in FIG. 4, three PMOS transistors 402, 404, and 406 are series-connected between the reference voltage (e.g., VDD) and the source electrode of the PMOS transistor 202, where the gate electrode (also known as "control electrode") of each of the PMOS transistors 402, 404, and 406 is arranged to receive the test enable signal STEB.

As shown in FIG. 1, the test enable signal STEB is generated from the inverter 140. Hence, when the scan output flip-flop 1 operates in the test mode due to the test enable signal STE being set at the high voltage level VH (STE=1), one NMOS transistor (not shown) in the inverter 140 is turned on to make the test enable signal STEB have the low voltage level VL (STEB=0). When the scan output flip-flop 1 operates under the test mode, the NMOS transistor (not shown) in the inverter 140 may also act as one second delay element coupled to the source electrode of the NMOS transistor 206. Hence, as shown in FIG. 4, two NMOS transistors 408 and 410 are series-connected between the test enable signal STEB and the source electrode of the PMOS transistor 206, where the gate electrode (also known as "control electrode") of each of the NMOS transistors 408 and 410 is arranged to receive the test enable signal STE.

When the test enable signal STE is at the high voltage level VH (STE=1), the scan output flip-flop 1 operates in the test mode. First delay elements coupled between the reference voltage (e.g., VDD) and the source electrode of the PMOS transistor 202 are enabled because the PMOS transistors 402, 404, and 406 are turned on in response to STEB=0. The second delay elements coupled between the test enable signal STEB and the source electrode of the NMOS transistor 206 are enabled because the NMOS transistors 408 and 410 are turned on in response to STE=1. It should be noted that one additional second delay element is enabled by an NMOS transistor (not shown) in the inverter 140 from which the test enable signal STEB is generated. With the help of the delay elements, the scan-out signal S16 output from one scan output flip-flop to the next scan output flip-flop can meet the hold time constraint.

When the test enable signal STE is at the low voltage level VL (STE=0), the scan output flip-flop 1 operates in the normal mode. First delay elements coupled between the reference voltage (e.g., VDD) and the source electrode of the PMOS transistor 202 are disabled because the PMOS transistors 402, 404, and 406 are turned off in response to STEB=1. The second delay elements coupled between the test enable signal STEB and the source electrode of the NMOS transistor 206 are disabled because the NMOS transistors 408 and 410 are turned off in response to STE=0. Since the PMOS transistor 204 is turned on to make the scan-out signal S16 have a fixed voltage level (e.g., VDD), the gating function of the scan-out stage circuit 400 under the normal mode is not affected by the PMOS transistors 402, 404, and 406 and the NMOS transistors 408 and 410.

Figure 5:
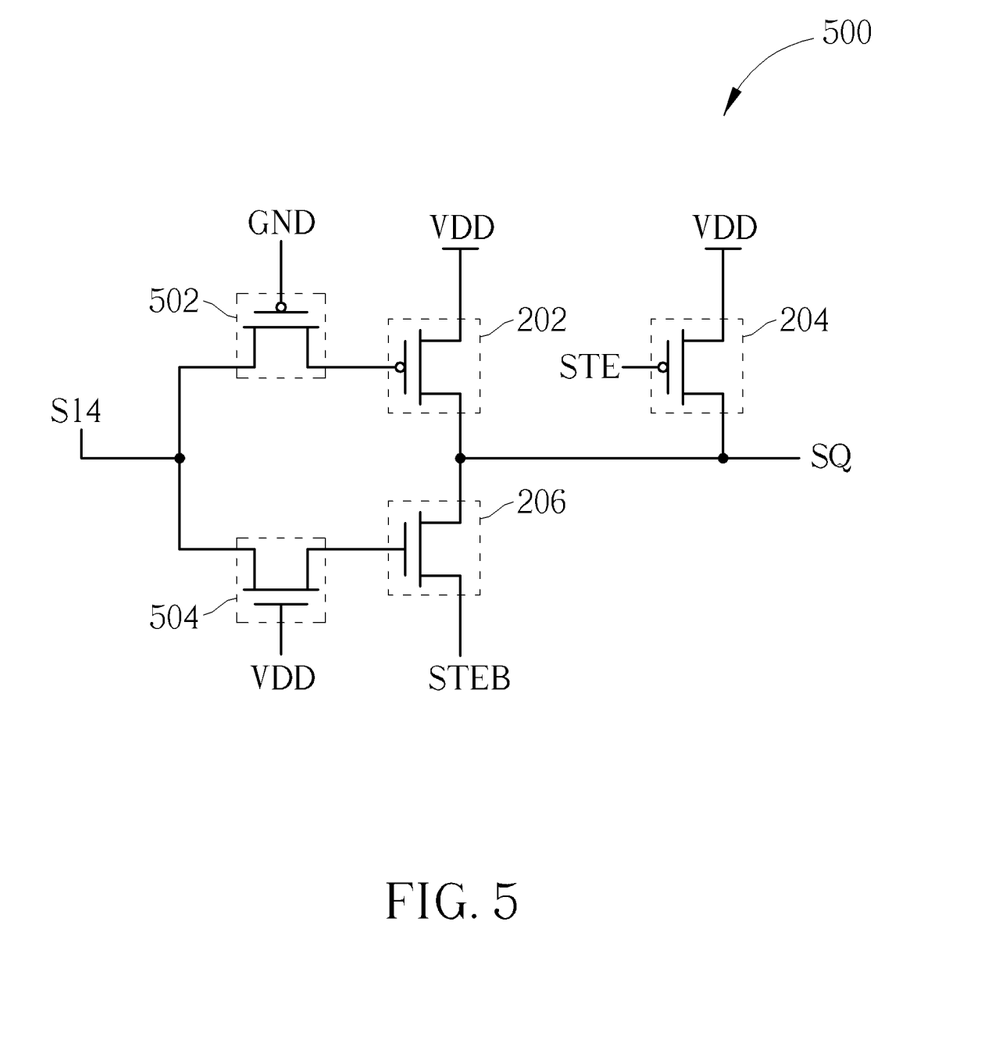
FIG. 5 is a diagram illustrating a scan-out stage circuit according to a fourth embodiment of the present invention.

FIG. 5 is a diagram illustrating a scan-out stage circuit according to a fourth embodiment of the present invention. The major difference between the scan-out stage circuits 200 and 500 is that the scan-out stage circuit 500 has at least one first delay element coupled between the control signal S14 and the gate electrode of the PMOS transistor 202 and at least one second delay element coupled between the control signal S14 and the gate electrode of the NMOS transistor 206. In this embodiment, each first delay element is implemented by a PMOS transistor, and each second delay element is implemented by an NMOS transistor. As shown in FIG. 5, one PMOS transistor 502 is coupled between the control signal S14 and the gate electrode of the PMOS transistor 202, where the gate electrode (also known as "control electrode") of the PMOS transistor 502 is arranged to receive one reference voltage (e.g., GND). In addition, one NMOS transistor 504 is coupled between the control signal S14 and the gate electrode of the NMOS transistor 206, where the gate electrode (also known as "control electrode") of the NMOS transistor 504 is arranged to receive another reference voltage (e.g., VDD).

When the test enable signal STE is at the high voltage level VH (STE=1), the scan output flip-flop 1 operates in the test mode. The gate electrode of the PMOS transistor 202 receives the control signal S14 via the first delay element implemented by the PMOS transistor 502 (which is turned on by the ground voltage GND). The gate electrode of the NMOS transistor 206 receives the control signal S14 via the second delay element implemented by the NMOS transistor 504 (which is turned on by the power supply voltage VDD). With the help of the delay elements, the scan-out signal S16 output from one scan output flip-flop to the next scan output flip-flop can meet the hold time constraint.

When the test enable signal STE is at the low voltage level VL (STE=0), the scan output flip-flop 1 operates in the normal mode. Since the PMOS transistor 204 is turned on to make the scan-out signal S16 have a fixed voltage level (e.g., VDD), the gating function of the scan-out stage circuit 500 under the normal mode is not affected by the PMOS transistor 502 and the NMOS transistor 504.

Figure 6:
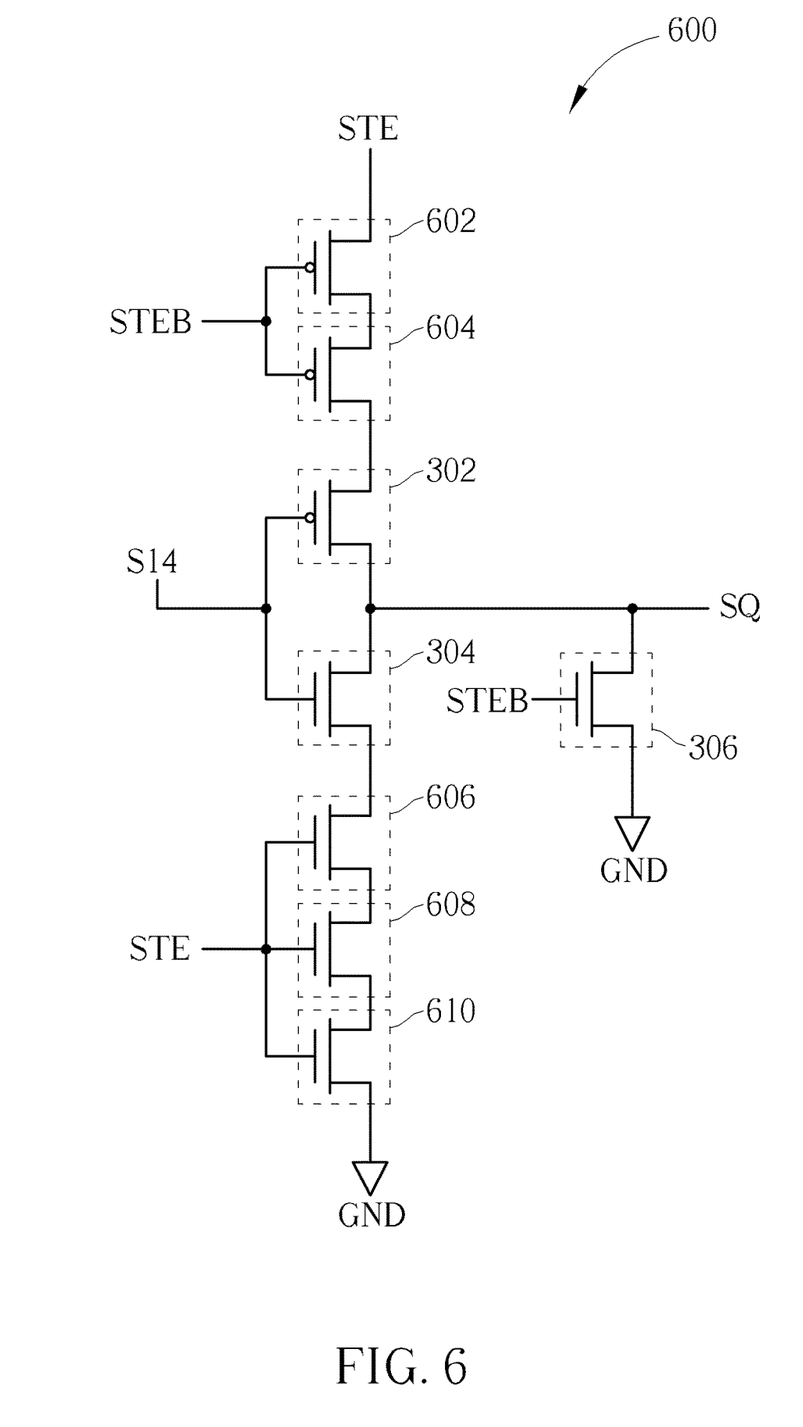
FIG. 6 is a diagram illustrating a scan-out stage circuit according to a fifth embodiment of the present invention.

FIG. 6 is a diagram illustrating a scan-out stage circuit according to a fifth embodiment of the present invention. The major difference between the scan-out stage circuits 300 and 600 is that the scan-out stage circuit 600 has at least one first delay element coupled between the reference voltage (e.g., GND) and the source electrode of the NMOS transistor 304 and at least one second delay element coupled between the test enable signal STE and the source electrode of the PMOS transistor 302. In this embodiment, each first delay element is implemented by an NMOS transistor, and each second delay element is implemented by a PMOS transistor. As shown in FIG. 6, NMOS transistors 606, 608, and 610 are series-connected between the reference voltage (e.g., GND) and the source electrode of the NMOS transistor 304, where the gate electrode (also known as "control electrode") of each of the NMOS transistors 606, 608, and 610 is arranged to receive the test enable signal STE. Furthermore, NMOS transistors 602 and 604 are series-connected between the test enable signal STE and the source electrode of the PMOS transistor 302, where the gate electrode (also known as "control electrode") of each of the PMOS transistors 602 and 604 is arranged to receive the test enable signal STEB.

When the test enable signal STE is at the high voltage level VH (STE=1), the scan output flip-flop 1 operates in the test mode. First delay elements coupled between the reference voltage (e.g., GND) and the source electrode of the NMOS transistor 304 are enabled because the NMOS transistors 606, 608, and 610 are turned on in response to STE=1. The second delay elements coupled between the test enable signal STE and the source electrode of the PMOS transistor 302 are enabled because the PMOS transistors 602 and 604 are turned on in response to STEB=0. With the help of the delay elements, the scan-out signal S16 output from one scan output flip-flop to the next scan output flip-flop can meet the hold time constraint.

When the test enable signal STE is at the low voltage level VL (STE=0), the scan output flip-flop 1 operates in the normal mode. First delay elements coupled between the reference voltage (e.g., GND) and the source electrode of the NMOS transistor 304 are disabled because the NMOS transistors 606, 608, and 610 are turned off in response to STE=0. The second delay elements coupled between the test enable signal STE and the source electrode of the PMOS transistor 302 are disabled because the PMOS transistors 602 and 604 are turned off in response to STEB=1. Since the PMOS transistor 306 is turned on to make the scan-out signal S16 have a fixed voltage level (e.g., GND), the gating function of the scan-out stage circuit 600 under the normal mode is not affected by the PMOS transistors 602 and 604 and the NMOS transistors 606, 608, and 610.

Figure 7:
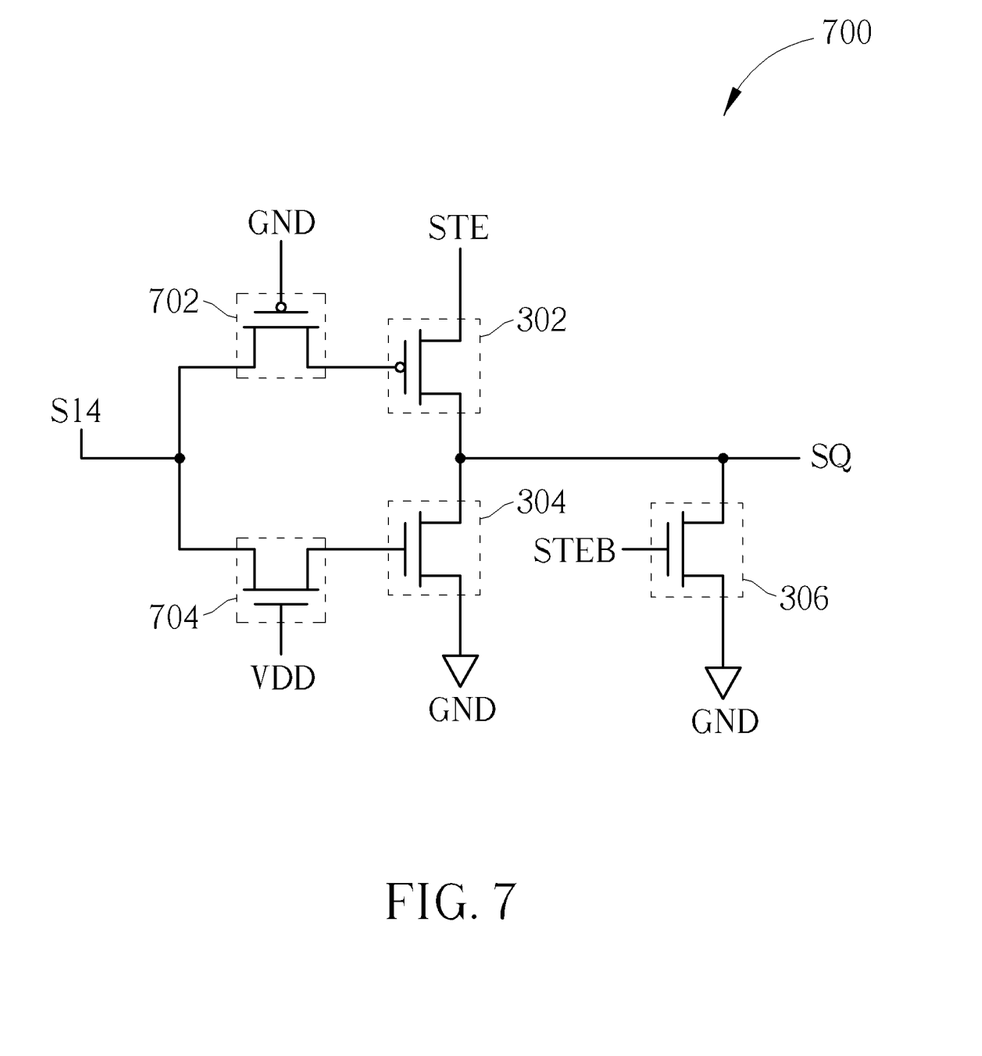
FIG. 7 is a diagram illustrating a scan-out stage circuit according to a sixth embodiment of the present invention.

FIG. 7 is a diagram illustrating a scan-out stage circuit according to a sixth embodiment of the present invention. The major difference between the scan-out stage circuits 300 and 700 is that the scan-out stage circuit 700 has at least one first delay element coupled between the control signal S14 and the gate electrode of the PMOS transistor 302 and at least one second delay element coupled between the control signal S14 and the gate electrode of the NMOS transistor 304. In this embodiment, each first delay element is implemented by a PMOS transistor, and each second delay element is implemented by an NMOS transistor. As shown in FIG. 7, one PMOS transistor 702 is coupled between the control signal S14 and the gate electrode of the PMOS transistor 302, where the gate electrode (also known as "control electrode") of the PMOS transistor 702 is arranged to receive one reference voltage (e.g., GND). In addition, one NMOS transistor 704 is coupled between the control signal S14 and the gate electrode of the NMOS transistor 304, where the gate electrode (also known as "control electrode") of the NMOS transistor 704 is arranged to receive another reference voltage (e.g., VDD).

When the test enable signal STE is at the high voltage level VH (STE=1), the scan output flip-flop 1 operates in the test mode. The gate electrode of the PMOS transistor 302 receives the control signal S14 via the first delay element implemented by the PMOS transistor 702 (which is turned on by the ground voltage GND). The gate electrode of the NMOS transistor 304 receives the control signal S14 via the second delay element implemented by the NMOS transistor 704 (which is turned on by the power supply voltage VDD). With the help of the delay elements, the scan-out signal S16 output from one scan output flip-flop to the next scan output flip-flop can meet the hold time constraint.

When the test enable signal STE is at the low voltage level VL (STE=0), the scan output flip-flop 1 operates in the normal mode. Since the NMOS transistor 306 is turned on to make the scan-out signal S16 have a fixed voltage level (e.g., GND), the gating function of the scan-out stage circuit 700 under the normal mode is not affected by the PMOS transistor 702 and the NMOS transistor 704.

As mentioned above, the scan-out stage circuit 12 is designed to have a gating function that is enabled under a normal mode to keep the scan-out signal S16 at a fixed voltage level. The same concept may be applied to the data-out signal S15 output from the data output terminal Q under a test mode.

Figure 8:
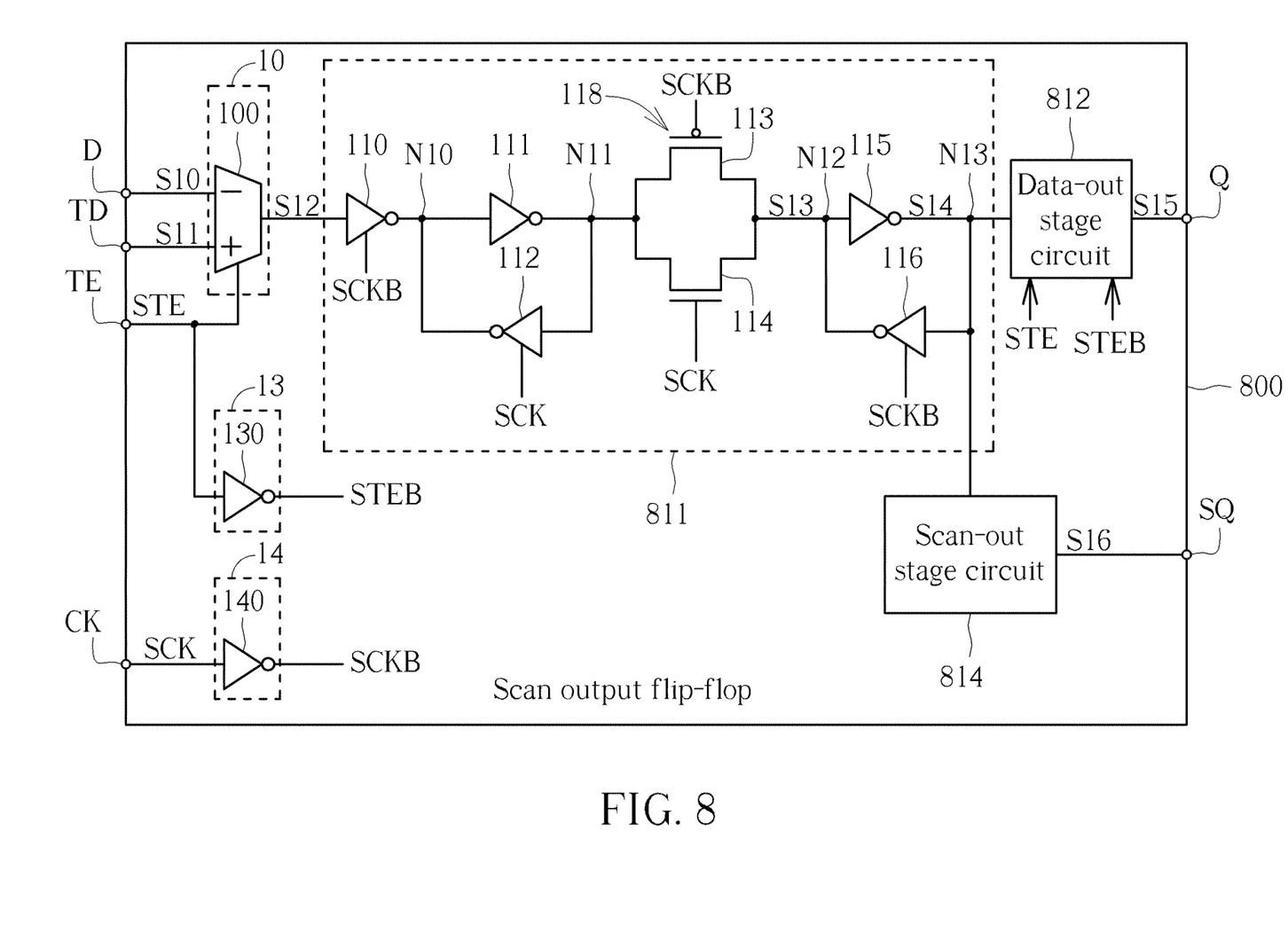
FIG. 8 is a diagram illustrating another scan output flip-flop according to an embodiment of the present invention.

FIG. 8 is a diagram illustrating another scan output flip-flop according to an embodiment of the present invention. As shown in FIG. 8, a scan output flip-flop 800 includes a control circuit 811, a data-out stage circuit 812, a scan-out stage circuit 814, and the aforementioned selection circuit 10, signal generation circuit 13 and clock generation circuit 14. Like the scan output flip-flop 1, the scan output flip-flop 800 has a data input terminal D, a scan input terminal TD, a test-enable terminal TE, a clock input terminal CK, a data output terminal Q, and a scan output terminal SQ. The control circuit 811 receives the input signal S12, where the data signal S10 is selected as the input signal S12 under the normal mode (STE=0), and the test signal S11 is selected as the input signal S12 under the test mode (STE=1). The control circuit 811 is controlled by the clock signals SCK and SCKB to generate control signals S13 and S14, where the control signal S14 is the inverse of the control signal S13. In the embodiment of FIG. 8, the control circuit 811 includes the aforementioned tri-state inverters 110, 112, and 116, inverters 111 and 115, and transmission gate 118. Since a person skilled in the art can readily understand details of the control circuit 811 after reading above paragraphs directed to the control circuit 11, similarly description is omitted here for brevity.

In one exemplary design, the scan-out stage circuit 814 may be the scan-out stage circuit 12 that can be implemented using one of the scan-out stage circuits 200, 300, 400, 500, 600, and 700. For example, only one of the control signals S13 and S14 is received by the scan-out stage circuit 814. In another exemplary design, the scan-out stage circuit 814 may be different from the scan-out stage circuit 12. For example, both of the control signals S13 and S14 are received by the scan-out stage circuit 814. In practice, any scan output flip-flop using the proposed data-out stage circuit 812 falls within the scope of the present invention.

In this embodiment, only one internal node of the control circuit 811 is accessed by the data-out stage circuit 812 to provide only one control signal (e.g., S14) from the control circuit 811 to the data-out stage circuit 812. As shown in FIG. 8, the data-out stage circuit 812 is coupled to the node N13 for receiving the control signal S14, and further receives the test enable signals STE and STEB. The data-out stage circuit 812 is controlled by the test enable signals STE and STEB to generate the data-out signal S15 according to only one control signal (e.g., S14) received from the control circuit 811. The data-out signal S15 is transmitted to the data output terminal Q.

When the scan output flip-flop 800 operates in a normal mode, the selection circuit 10 transmits the data signal S10 to the output terminal of the selection circuit 10 according to the test enable signal STE at the low voltage level VL (STE=0) to serve as the input signal S12, and a voltage level of the data-out signal S15 varies with a voltage level of the data signal S10.

When the scan output flip-flop 800 operates in a test mode, the selection circuit 10 transmits the test signal S11 to the output terminal of the selection circuit 10 according to the test enable signal STE at the high voltage level VH (STE=1) to serve as the input signal S12, and the data-out stage circuit 812 keeps the data-out signal S15 at a fixed voltage level (e.g., high voltage level or low voltage level) regardless of a voltage level of the test signal S11. Multiple scan output flip-flops 800 may be applied in a scan chain, and one combinational logic circuit is added in the data path between the data output terminal Q of one scan output flip-flop and the data input terminal D of the following scan output flip-flop. In this case, the data-out stage circuit 812 in each scan output flip-flop gates the data-out signal S15 of the data output terminal Q under the test mode, which avoids additional power consumption by the combinational logic circuits.

Figure 9:
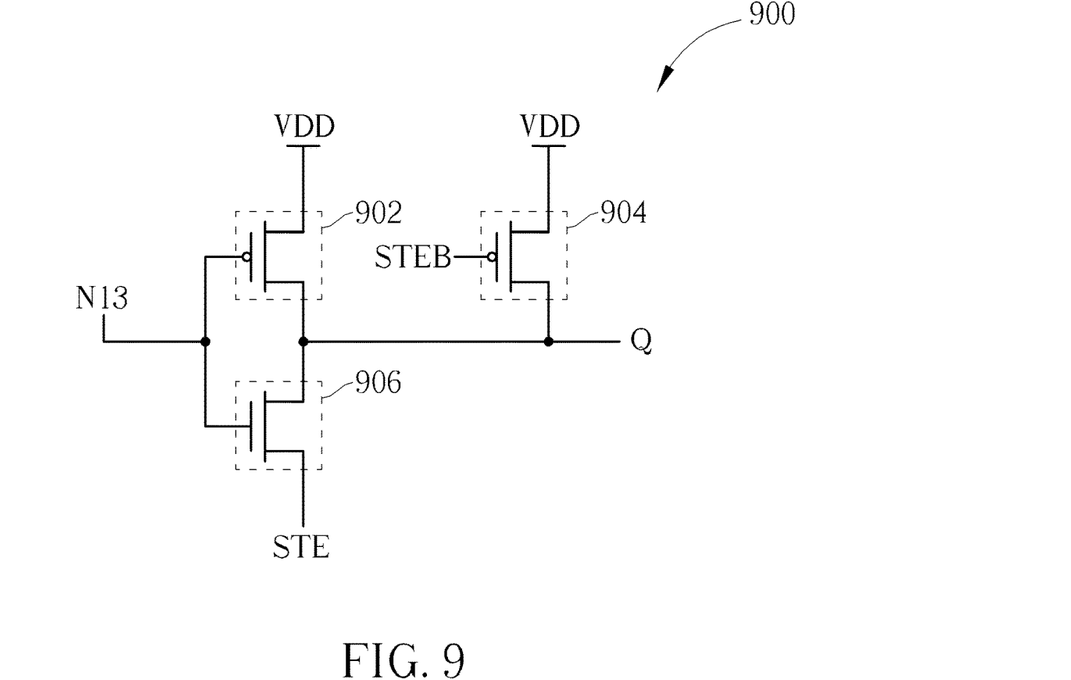
FIG. 9 is a diagram illustrating a data-out stage circuit according to a first embodiment of the present invention.

FIG. 9 is a diagram illustrating a data-out stage circuit according to a first embodiment of the present invention. The data-out stage circuit 812 shown in FIG. 8 may be implemented using the data-out stage circuit 900 shown in FIG. 9. The data-out stage circuit 900 includes three transistors 902, 904, and 906. In the embodiment of FIG. 9, the transistors 902 and 904 are PMOS transistors, while the transistor 906 is an NMOS transistor. The gate electrode (also known as a "control electrode") of the PMOS transistor 904 is arranged to receive one test enable signal STEB, the source electrode of the PMOS transistor 904 is arranged to receive one reference voltage (e.g., power supply voltage VDD that is a relatively high voltage level) of the data-out stage circuit 900, and the drain electrode of the PMOS transistor 904 is coupled to the data output terminal Q. The gate electrode (also known as a "control electrode") of the PMOS transistor 902 is coupled to the node N13 for receiving the control signal S14, the source electrode of the PMOS transistor 902 is arranged to receive one reference voltage (e.g., power supply voltage VDD) of the data-out stage circuit 900, and the drain electrode of the PMOS transistor 902 is coupled to the data output terminal Q. The gate electrode (also known as a "control electrode") of the NMOS transistor 906 is coupled to the node N13 for receiving the control signal S14, the source electrode of the NMOS transistor 906 is arranged to receive another test enable signal STE, and the drain electrode of the NMOS transistor 906 is coupled to the data output terminal Q.

The scan output flip-flop 800 can selectively operate in a normal mode or a test mode in response to the test enable signal STE. When the test enable signal STE is at the low voltage level VL (STE=0), the scan output flip-flop 800 operates in the normal mode. Since the test enable signal STEB is the inverse of the test enable signal STE, the PMOS transistor 904 is turned off due to STEB=1. Since the test enable signal STE is at the low voltage level VL (STE=0), the PMOS transistor 902 and the NMOS transistor 906 form an inverter that functions as the inverter 117 included in the control circuit 11 of the scan output flip-flop 1 shown in FIG. 1. Hence, a voltage level of the data-out signal S15 varies with the inverse of a voltage level of the control signal S14, where the control signal S14 is derived from processing of the data signal S10. Moreover, since the inverter 117 shown in FIG. 1 may be implemented using the PMOS transistor 902 and the NMOS transistor 906 shown in FIG. 9, the data-out stage circuit 900 requires only one extra transistor (i.e., PMOS transistor 904) and therefore has very low area penalty.

When the test enable signal STE is at the high voltage level VH (STE=1), the scan output flip-flop 800 operates in the test mode. Since the test enable signal STE is at the high voltage level VH (STE=1), the PMOS transistor 902 and the NMOS transistor 906 do not form an inverter. Specifically, a voltage level at the data output terminal Q is not pulled low through any of the PMOS transistor 902 and the NMOS transistor 906. In addition, since the test enable signal STEB is the inverse of the test enable signal STE, the PMOS transistor 904 is turned on due to STEB=0. Hence, a voltage level at the data output terminal Q is pulled high by the power supply voltage VDD through the PMOS transistor 904. In this way, the data-out stage circuit 900 keeps the data-out signal S15 at a fixed voltage level (e.g., VDD) regardless of a voltage level of the test signal S11.

Figure 10:
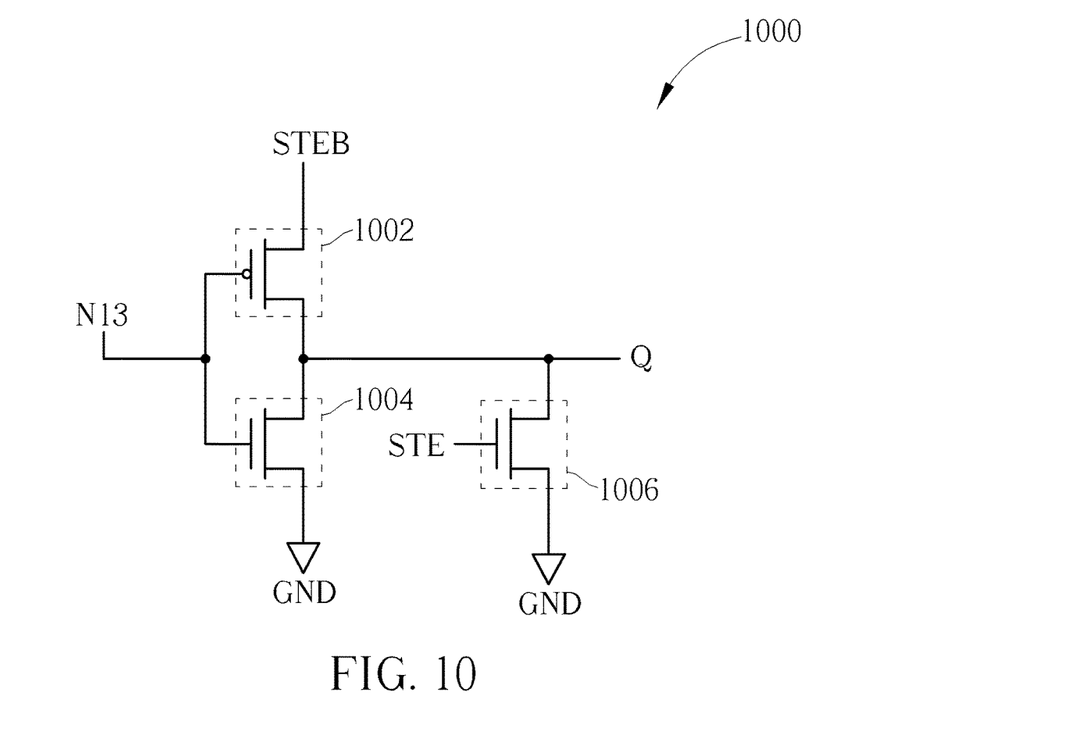
FIG. 10 is a diagram illustrating a data-out stage circuit according to a second embodiment of the present invention.

FIG. 10 is a diagram illustrating a data-out stage circuit according to a second embodiment of the present invention. The data-out stage circuit 812 shown in FIG. 8 may be implemented using the data-out stage circuit 1000 shown in FIG. 10. The data-out stage circuit 1000 includes three transistors 1002, 1004, 1006. In the embodiment of FIG. 10, the transistor 1002 is a PMOS transistor, while the transistors 1004 and 1006 are NMOS transistors. The gate electrode (also known as a "control electrode") of the NMOS transistor 1006 is arranged to receive one test enable signal STE, the source electrode of the NMOS transistor 1006 is arranged to receive one reference voltage (e.g., ground voltage GND) of the data-out stage circuit 1000, and the drain electrode of the NMOS transistor 1006 is coupled to the data output terminal Q. The gate electrode (also known as a "control electrode") of the NMOS transistor 1004 is coupled to the node N13 for receiving the control signal S14, the source electrode of the NMOS transistor 1004 is arranged to receive one reference voltage (e.g., ground voltage GND) of the data-out stage circuit 1000, and the drain electrode of the NMOS transistor 1004 is coupled to the data output terminal Q. The gate electrode (also known as a "control electrode") of the PMOS transistor 1002 is coupled to the node N13 for receiving the control signal S14, the source electrode of the PMOS transistor 1002 is arranged to receive another test enable signal STEB, and the drain electrode of the PMOS transistor 1002 is coupled to the data output terminal Q.

The scan output flip-flop 800 can selectively operate in a normal mode or a test mode in response to the test enable signal STE. When the test enable signal STE is at the low voltage level VL (STE=0), the scan output flip-flop 800 operates in the normal mode. The NMOS transistor 1006 is turned off due to STE=0. Since the test enable signal STEB is the inverse of the test enable signal STE, the PMOS transistor 1002 and the NMOS transistor 1004 form an inverter that functions as the inverter 117 included in the control circuit 11 of the scan output flip-flop 1 shown in FIG. 1. Hence, a voltage level of the data-out signal S15 varies with the inverse of a voltage level of the control signal S14, where the control signal S14 is derived from processing of the data signal S10. Moreover, since the inverter 117 shown in FIG. 1 may be implemented using the PMOS transistor 1002 and the NMOS transistor 1004 shown in FIG. 10, the data-out stage circuit 1000 requires only one extra transistor (i.e., PMOS transistor 1006) and therefore has very low area penalty.

When the test enable signal STE is at the high voltage level VH (STE=1), the scan output flip-flop 800 operates in the test mode. Since the test enable signal STEB is the inverse of the test enable signal STE, the PMOS transistor 1002 and the NMOS transistor 1004 do not form an inverter. Specifically, a voltage level at the data output terminal Q is not pulled high through any of the PMOS transistor 1002 and the NMOS transistor 1004. In addition, the NMOS transistor 1006 is turned on due to STE=1. Hence, a voltage level at the data output terminal Q is pulled low by the ground voltage GND through the NMOS transistor 1006. In this way, the data-out stage circuit 1000 keeps the data-out signal S15 at a fixed voltage level (e.g., GND) regardless of a voltage level of the test signal S11.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A scan output flip-flop for outputting a scan-out signal at a scan output terminal of the scan output flip-flop, comprising:
   a selection circuit, having a first input terminal and a second input terminal and controlled by a first test enable signal to transmit a data signal on the first input terminal or a test signal on the second input terminal to an output terminal of the selection circuit to serve as an input signal;
   a control circuit, coupled to the output terminal of the selection circuit and controlled by a first clock signal and a second clock signal to generate a first control signal and a second control signal according to the input signal, wherein the second clock signal is an inverse of the first clock signal, and the second control signal is an inverse of the first control signal; and
   a scan-out stage circuit, wherein the scan-out stage circuit receives only one of the first control signal and the second control signal, and is controlled by the first test enable signal and a second test enable signal to generate the scan-out signal according to said only one of the first control signal and the second control signal, where the second test enable signal is an inverse of the first test enable signal.

2. The scan output flip-flop of claim 1, wherein when the scan output flip-flop operates in a normal mode, the selection circuit transmits the data signal to the output terminal of the selection circuit according to the first test enable signal to serve as the input signal, and the scan-out stage circuit keeps the scan-out signal at a fixed voltage level regardless of a voltage level of the data signal.

3. The scan output flip-flop of claim 1, wherein the scan-out stage circuit comprises:
   a first first-type transistor, having a control electrode arranged to receive the first test enable signal, a first electrode arranged to receive a reference voltage of the scan output flip-flop, and a second electrode coupled to the scan output terminal;
   a second first-type transistor, having a control electrode arranged to receive said only one of the first control signal and the second control signal, a first electrode arranged to receive the reference voltage, and a second electrode coupled to the scan output terminal; and
   a second-type transistor, having a control electrode arranged to receive said only one of the first control signal and the second control signal, a first electrode arranged to receive the second test enable signal, and a second electrode coupled to the scan output terminal.

4. The scan output flip-flop of claim 3, wherein the second-type transistor is implemented by an N-type transistor, the first first-type transistor and the second first-type transistor are implemented by P-type transistors, and the reference voltage is a power-supply voltage of the scan output flip-flop.

5. The scan output flip-flop of claim 1, wherein the scan-out stage circuit comprises:
   a first first-type transistor, having a control electrode arranged to receive the first test enable signal, a first electrode arranged to receive a reference voltage of the scan output flip-flop, and a second electrode coupled to the scan output terminal;
   a second first-type transistor, having a control electrode arranged to receive said only one of the first control signal and the second control signal, a first electrode, and a second electrode coupled to the scan output terminal;
   a first second-type transistor, having a control electrode arranged to receive said only one of the first control signal and the second control signal, a first electrode, and a second electrode coupled to the scan output terminal;
   at least one first delay element, coupled between the first electrode of the second first-type transistor and the reference voltage; and
   at least one second delay element, coupled between the first electrode of the first second-type transistor and the second test enable signal.

6. The scan output flip-flop of claim 5, wherein each first delay element included in said at least one first delay element is implemented by a third first-type transistor having a control electrode arranged to receive the second test enable signal, and each second delay element included in said at least one second delay element is implemented by a second second-type transistor having a control electrode arranged to receive the first test enable signal.

7. The scan output flip-flop of claim 6, wherein the first second-type transistor and the second second-type transistor are implemented by N-type transistors, the first first-type transistor, the second first-type transistor and the third first-type transistor are implemented by P-type transistors, and the reference voltage is a power-supply voltage of the scan output flip-flop.

8. The scan output flip-flop of claim 1, wherein the scan-out stage circuit comprises:
   a first first-type transistor, having a control electrode arranged to receive the first test enable signal, a first electrode arranged to receive a first reference voltage of the scan output flip-flop, and a second electrode coupled to the scan output terminal;
   a second first-type transistor, having a control electrode, a first electrode arranged to receive the first reference voltage, and a second electrode coupled to the scan output terminal;
   a first second-type transistor, having a control electrode, a first electrode arranged to receive the second test enable signal, and a second electrode coupled to the scan output terminal;
   at least one first delay element, coupled between the control electrode of the second first-type transistor and said only one of the first control signal and the second control signal; and
   at least one second delay element, coupled between the control electrode of the first second-type transistor and said only one of the first control signal and the second control signal.

9. The scan output flip-flop of claim 8, wherein each first delay element included in said at least one first delay element is implemented by a third first-type transistor having a control electrode arranged to receive a second reference voltage of the scan output flip-flop, and each second delay element included in said at least one second delay element is implemented by a second second-type transistor having a control electrode arranged to receive the first reference voltage.

10. The scan output flip-flop of claim 9, wherein the first second-type transistor and the second second-type transistor are implemented by N-type transistors, the first first-type transistor, the second first-type transistor and the third first-type transistor are implemented by P-type transistors, the first reference voltage is a power-supply voltage of the scan output flip-flop, and the second reference voltage is a ground voltage of the scan output flip-flop.

11. The scan output flip-flop of claim 1, wherein the scan-out stage circuit comprises:
- a first first-type transistor, having a control electrode arranged to receive the second test enable signal, a first electrode arranged to receive a reference voltage of the scan output flip-flop, and a second electrode coupled to the scan output terminal;
- a second first-type transistor, having a control electrode arranged to receive said only one of the first control signal and the second control signal, a first electrode arranged to receive the reference voltage, and a second electrode coupled to the scan output terminal; and
- a second-type transistor, having a control electrode arranged to receive said only one of the first control signal and the second control signal, a first electrode arranged to receive the first test enable signal, and a second electrode coupled to the scan output terminal.

12. The scan output flip-flop of claim 11, wherein the second-type transistor is implemented by a P-type transistor, the first first-type transistor and the second first-type transistor are implemented by N-type transistors, and the reference voltage is a ground voltage of the scan output flip-flop.

13. The scan output flip-flop of claim 1, wherein the scan-out stage circuit comprises:
- a first first-type transistor, having a control electrode arranged to receive the second test enable signal, a first electrode arranged to receive a reference voltage of the scan output flip-flop, and a second electrode coupled to the scan output terminal;
- a second first-type transistor, having a control electrode arranged to receive said only one of the first control signal and the second control signal, a first electrode, and a second electrode coupled to the scan output terminal;
- a first second-type transistor, having a control electrode arranged to receive said only one of the first control signal and the second control signal, a first electrode, and a second electrode coupled to the scan output terminal;
- at least one first delay element, coupled between the first electrode of the second first-type transistor and the reference voltage; and
- at least one second delay element, coupled between the first electrode of the first second-type transistor and the first test enable signal.

14. The scan output flip-flop of claim 13, wherein each first delay element included in said at least one first delay element is implemented by a third first-type transistor having a control electrode arranged to receive the first test enable signal, and each second delay element included in said at least one second delay element is implemented by a second second-type transistor having a control electrode arranged to receive the second test enable signal.

15. The scan output flip-flop of claim 14, wherein the first second-type transistor and the second second-type transistor are implemented by P-type transistors, the first first-type transistor, the second first-type transistor and the third first-type transistor are implemented by N-type transistors, and the reference voltage is a ground voltage of the scan output flip-flop.

16. The scan output flip-flop of claim 1, wherein the scan-out stage circuit comprises:
- a first first-type transistor, having a control electrode arranged to receive the second test enable signal, a first electrode arranged to receive a first reference voltage of the scan output flip-flop, and a second electrode coupled to the scan output terminal;
- a second first-type transistor, having a control electrode, a first electrode arranged to receive the first reference voltage, and a second electrode coupled to the scan output terminal;
- a first second-type transistor, having a control electrode, a first electrode arranged to receive the first test enable signal, and a second electrode coupled to the scan output terminal;
- at least one first delay element, coupled between the control electrode of the second first-type transistor and said only one of the first control signal and the second control signal; and
- at least one second delay element, coupled between the control electrode of the first second-type transistor and said only one of the first control signal and the second control signal.

17. The scan output flip-flop of claim 16, wherein each first delay element included in said at least one first delay element is implemented by a third first-type transistor having a control electrode arranged to receive a second reference voltage of the scan output flip-flop, and each second delay element included in said at least one second delay element is implemented by a second second-type transistor having a control electrode arranged to receive the first reference voltage.

18. The scan output flip-flop of claim 17, wherein the first second-type transistor and the second second-type transistor are implemented by P-type transistors, the first first-type transistor, the second first-type transistor and the third first-type transistor are implemented by N-type transistors, the first reference voltage is a ground voltage of the scan output flip-flop, and the second reference voltage is a power-supply voltage of the scan output flip-flop.

19. A scan output flip-flop for outputting a data-out signal at a data output terminal of the scan output flip-flop, comprising:
- a selection circuit, having a first input terminal and a second input terminal and controlled by a first test enable signal to transmit a data signal on the first input terminal or a test signal on the second input terminal to an output terminal of the selection circuit to serve as an input signal;
- a control circuit, coupled to the output terminal of the selection circuit and controlled by a first clock signal and a second clock signal to generate a control signal according to the input signal, wherein the second clock signal is an inverse of the first clock signal; and
- a data-out stage circuit, wherein the data-out stage circuit receives the control signal, and is controlled by the first test enable signal and a second test enable signal to generate the data-out signal according to the control signal, where the second test enable signal is an inverse of the first test enable signal.

20. The scan output flip-flop of claim 19, wherein when the scan output flip-flop operates in a test mode, the selection circuit transmits the test signal to the output terminal of the selection circuit according to the first test enable signal to serve as the input signal, and the data-out stage circuit keeps the data-out signal at a fixed voltage level regardless of a voltage level of the test signal.

21. The scan output flip-flop of claim 19, wherein the data-out stage circuit comprises:
- a first first-type transistor, having a control electrode arranged to receive the second test enable signal, a first electrode arranged to receive a reference voltage of the scan output flip-flop, and a second electrode coupled to the data output terminal;

a second first-type transistor, having a control electrode arranged to receive the control signal, a first electrode arranged to receive the reference voltage, and a second electrode coupled to the data output terminal; and a second-type transistor, having a control electrode arranged to receive the control signal, a first electrode arranged to receive the first test enable signal, and a second electrode coupled to the data output terminal.

22. The scan output flip-flop of claim 21, wherein the second-type transistor is implemented by an N-type transistor, the first first-type transistor and the second first-type transistor are implemented by P-type transistors, and the reference voltage is a power-supply voltage of the scan output flip-flop.

23. The scan output flip-flop of claim 19, wherein the data-out stage circuit comprises:

a first first-type transistor, having a control electrode arranged to receive the first test enable signal, a first electrode arranged to receive a reference voltage of the scan output flip-flop, and a second electrode coupled to the data output terminal;

a second first-type transistor, having a control electrode arranged to receive the control signal, a first electrode arranged to receive the reference voltage, and a second electrode coupled to the data output terminal; and a second-type transistor, having a control electrode arranged to receive the control signal, a first electrode arranged to receive the second test enable signal, and a second electrode coupled to the data output terminal.

24. The scan output flip-flop of claim 23, wherein the second-type transistor is implemented by a P-type transistor, the first first-type transistor and the second first-type transistor are implemented by N-type transistors, and the reference voltage is a ground voltage of the scan output flip-flop.

* * * * *